(12) United States Patent
Van De Sluis et al.

(10) Patent No.: US 12,625,218 B2
(45) Date of Patent: May 12, 2026

(54) SYSTEM FOR MONITORING A SPACE BY A PORTABLE SENSOR DEVICE AND A METHOD THEREOF

(71) Applicant: SIGNIFY HOLDING B.V., Eindhoven (NL)

(72) Inventors: Bartel Marinus Van De Sluis, Eindhoven (NL); Dzmitry Viktorovich Aliakseyeu, Eindhoven (NL); Tobias Borra, Rijswijk (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 613 days.

(21) Appl. No.: 17/914,537

(22) PCT Filed: Mar. 26, 2021

(86) PCT No.: PCT/EP2021/057886
§ 371 (c)(1),
(2) Date: Sep. 26, 2022

(87) PCT Pub. No.: WO2021/198057
PCT Pub. Date: Oct. 7, 2021

(65) Prior Publication Data
US 2023/0144497 A1 May 11, 2023

(30) Foreign Application Priority Data
Mar. 30, 2020 (EP) ..................................... 20166559

(51) Int. Cl.
*H04N 5/00* (2011.01)
*G01J 5/00* (2022.01)
(Continued)

(52) U.S. Cl.
CPC ............... *G01S 1/02* (2013.01); *G01J 5/0025* (2013.01); *G01R 31/382* (2019.01)

(58) Field of Classification Search
USPC .......................................................... 348/77
See application file for complete search history.

(56) References Cited

U.S. PATENT DOCUMENTS 7,830,410 B2 11/2010 Kondo et al.
9,235,976 B2 1/2016 Sloo et al.
(Continued)

FOREIGN PATENT DOCUMENTS

EP 3445139 A1 2/2019
JP 2008312047 A 12/2008
(Continued)

*Primary Examiner* — Nigar Chowdhury

(57) ABSTRACT

A method and a system for monitoring a space by a portable sensor device (102) are disclosed. The portable sensor device (102) comprising a first sensor (120) of a first sensor type for providing first sensor data indicative of first environmental information in the space, and a second sensor (122) of a second sensor type for providing second sensor data indicative of second environmental information in the space. The method comprises determining a location of the portable sensor device (102) in the space, transmitting, if the portable sensor device (102) is located at the first location, the first sensor data indicative of the first environmental information via the communication unit to a first device or application (110) of a plurality of devices or applications (110, 112), and transmitting, if the portable sensor (device 102) is located at the second location, the second sensor data indicative of the second environmental information via the communication unit to a second device or application (112) of the plurality of devices or applications (110, 112).

14 Claims, 3 Drawing Sheets

(51) Int. Cl.
    *G01R 31/382*       (2019.01)
    *G01S 1/02*        (2010.01)

(56)             References Cited

U.S. PATENT DOCUMENTS

| | | | |
|---|---|---|---|
| 9,960,929 | B2 | 5/2018 | Fadell et al. |
| 10,004,125 | B2 | 6/2018 | Donhowe et al. |
| 10,490,033 | B1 * | 11/2019 | Lemberger ............. G08B 13/00 |
| 10,560,149 | B1 * | 2/2020 | Skeoch ................... H04B 3/54 |
| 10,593,174 | B1 * | 3/2020 | Yoon .................. H04L 12/2816 |
| 10,594,987 | B1 * | 3/2020 | Nixon ..................... H04N 7/18 |
| 10,594,990 | B1 * | 3/2020 | Lemberger ............. H04W 4/80 |
| 10,650,657 | B1 * | 5/2020 | Curran .............. G08B 21/0446 |
| 10,665,082 | B1 * | 5/2020 | Hruska ............... G08B 21/182 |
| 10,666,913 | B1 * | 5/2020 | Siminoff ............... H04N 7/186 |
| 10,713,928 | B1 * | 7/2020 | Gerstberger ..... G08B 13/19645 |
| 10,735,696 | B1 * | 8/2020 | Yoon ...................... H04N 7/147 |
| 10,742,939 | B1 * | 8/2020 | Sommerlatt ..... G06Q 20/40145 |
| 10,755,537 | B1 * | 8/2020 | Palmer ............ G08B 13/19695 |
| 10,762,769 | B1 * | 9/2020 | Sommerlatt .......... G08B 25/12 |
| 10,769,909 | B1 * | 9/2020 | Modestine .......... G06V 20/52 |
| 10,777,057 | B1 * | 9/2020 | Siminoff ................ H04R 27/00 |
| 10,791,607 | B1 * | 9/2020 | Modestine .......... H05B 47/105 |
| 10,810,854 | B1 * | 10/2020 | Correnti .............. G08B 29/186 |
| 10,846,960 | B1 * | 11/2020 | Lemberger ............ G06V 20/63 |
| 10,878,671 | B1 * | 12/2020 | Skeoch .................. H04N 7/186 |
| 10,914,811 | B1 * | 2/2021 | Wild ................... H04M 11/025 |
| 10,921,763 | B1 * | 2/2021 | Correnti .............. G05D 1/0011 |
| 10,922,547 | B1 * | 2/2021 | Siminoff .............. H04N 23/661 |
| 10,930,126 | B1 * | 2/2021 | Jeong ................. H04N 23/611 |
| 11,018,939 | B1 * | 5/2021 | Harris ................ G06K 7/1413 |
| 11,032,762 | B1 * | 6/2021 | Wild ..................... H04L 12/12 |
| 11,101,843 | B1 * | 8/2021 | Wild ..................... H04B 1/715 |
| 11,115,629 | B1 * | 9/2021 | Lemberger ............. G10L 13/00 |
| 11,115,630 | B1 * | 9/2021 | Lemberger ............. G06F 3/167 |
| 11,153,538 | B1 * | 10/2021 | Lemberger .......... H04N 23/617 |
| 11,163,097 | B1 * | 11/2021 | Brailovskiy ............. G03B 5/02 |
| 11,232,685 | B1 * | 1/2022 | Nixon ................. G06V 10/757 |
| 11,243,959 | B1 * | 2/2022 | Gilboa .................. G06F 16/285 |
| 11,257,226 | B1 * | 2/2022 | Solh ........................ G06F 18/22 |
| 11,276,180 | B1 * | 3/2022 | Gluckman .......... H04N 19/567 |
| 11,302,156 | B1 * | 4/2022 | Gordiichuk ...... G08B 13/19684 |
| 11,343,551 | B1 * | 5/2022 | Brailovskiy ..... H04N 21/23439 |
| 11,349,707 | B1 * | 5/2022 | Gerstberger ........... H04N 7/186 |
| 11,350,060 | B1 * | 5/2022 | Mitura ................... H04N 7/188 |
| 11,393,108 | B1 * | 7/2022 | Modestine ....... G08B 13/19636 |
| 11,395,225 | B1 * | 7/2022 | Wong .................... H04W 76/28 |
| 11,501,618 | B1 * | 11/2022 | Siminoff ............... G06V 20/52 |
| 11,523,488 | B1 * | 12/2022 | Recker ................. H05B 47/105 |
| 11,538,317 | B1 * | 12/2022 | Shahamat ........ G08B 13/19684 |
| 11,546,951 | B1 * | 1/2023 | Siminoff ............... H04N 7/186 |
| 11,627,289 | B1 * | 4/2023 | Siminoff ............... H04N 7/183 |
| | | | 348/155 |
| 12,014,611 | B1 * | 6/2024 | Zareba ............. G08B 13/19602 |
| 12,015,498 | B1 * | 6/2024 | Lemberger .......... H04L 12/2807 |
| 12,061,687 | B1 * | 8/2024 | Siminoff ............... H04W 12/04 |
| 12,063,458 | B1 * | 8/2024 | Siminoff ............... H04N 7/188 |
| 2004/0036603 | A1 * | 2/2004 | Bingham ......... G08B 13/19628 |
| | | | 340/541 |
| 2015/0287310 | A1 * | 10/2015 | Deliuliis ................ G08B 25/10 |
| | | | 340/628 |
| 2016/0162674 | A1 * | 6/2016 | Friedman ................. G07C 9/37 |
| | | | 340/5.52 |
| 2016/0345406 | A1 | 11/2016 | Donhowe et al. |
| 2019/0044641 | A1 * | 2/2019 | Trundle ................... H04K 3/94 |
| 2019/0098725 | A1 * | 3/2019 | Sadwick ............... H05B 45/20 |
| 2019/0215583 | A1 * | 7/2019 | Gharabegian .......... H04W 4/80 |
| 2019/0246077 | A1 * | 8/2019 | Siminoff ............. H04M 1/0291 |
| 2019/0287063 | A1 * | 9/2019 | Skaaksrud .............. B60C 5/005 |
| 2019/0304228 | A1 * | 10/2019 | Trundle ............... G06Q 50/163 |
| 2019/0327128 | A1 * | 10/2019 | Harpole ............. H04L 41/0668 |
| 2019/0347916 | A1 * | 11/2019 | Wild ................... H04L 67/1095 |
| 2019/0373222 | A1 | 12/2019 | Chiu |
| 2020/0035082 | A1 * | 1/2020 | Lee ........................... G08B 5/22 |
| 2020/0394882 | A1 * | 12/2020 | England ................... E06B 7/30 |
| 2021/0074138 | A1 * | 3/2021 | Micko ............... G08B 21/0492 |
| 2022/0376990 | A1 * | 11/2022 | Sundermeyer .......... H04L 67/12 |
| 2024/0111347 | A1 * | 4/2024 | Raji .................... H04L 12/2825 |

FOREIGN PATENT DOCUMENTS

| | | |
|---|---|---|
| WO | 1999056262 A1 | 11/1999 |
| WO | 2017206870 A1 | 12/2017 |
| WO | 2018160990 A1 | 9/2018 |

* cited by examiner

SYSTEM FOR MONITORING A SPACE BY A PORTABLE SENSOR DEVICE AND A METHOD THEREOF

CROSS-REFERENCE TO PRIOR APPLICATIONS

This application is the U.S. National Phase application under 35 U.S.C. § 371 of International Application No. PCT/EP2021/057886, filed on Mar. 26, 2021, which claims the benefit of European Patent Application No. 20166559.3, filed on Mar. 30, 2020. These applications are hereby incorporated by reference herein.

FIELD OF THE INVENTION

The invention relates to a method for monitoring a space and a computer program product for executing the method. The invention further relates to a system for monitoring the space.

BACKGROUND

More and more sensor devices are being used as part of smart home systems, as they enable automatic control of devices, such as for example lighting devices, to a desired setting based on a detected sensor input. Sensor devices are getting more advanced, often combining multiple sensor modalities. For example, the Philips Hue Motion Sensor comprises an integrated light sensor, a temperature sensor and a PIR sensor.

A sensor device that combines multiple modalities is also disclosed in US 2016/0345406 A1. The path light control device disclosed in the patent application can include a processor, light source and any combination of ambient light sensors, passive infrared sensors, accelerometers and compass sensors. In one embodiment, the orientation of the sensor is determined, a degree of sensor function in such orientation is determined and sensor operation is disabled when the detected orientation indicates the data of the sensor is not applicable for proper device control.

WO1999056262A1 discloses an automatic control system for actuators and security devices in building automation. A wrist-held sensor and transmitter unit transmits repeatedly, in the form of short telegrams, messages indicating the physiological condition of user to a receiver and control apparatus. The receiver and control apparatus uses the physiological condition of a user as a basis to conduct control selections and to control automatically the actuators and security devices in accordance with the physiological condition of a person who carries the transmitter unit. The control selections can be influenced also by a piece of information indicating the location of a user Sensor devices are not only used as part of lighting systems, but also for other applications, e.g. security. Each application typically uses its own sensor devices. This results in many sensor devices being installed in homes and offices, which increases power consumption and decreases the buildings' aesthetics.

SUMMARY OF THE INVENTION

It is an object of the invention to provide a portable sensor device which can be used to reduce the number of portable sensor devices that is needed for a certain set of applications. According to a first aspect of the present invention, the object is achieved by a method of monitoring a space by a portable sensor device, the portable sensor device comprising a first sensor of a first sensor type for providing first sensor data indicative of first environmental information in the space, and a second sensor of a second sensor type different from the first sensor type for providing second sensor data indicative of second environmental information in the space, the method comprising:

determining a location of the portable sensor device in the space, transmitting, if the portable sensor device is located at a first location in the space, the first sensor data indicative of the first environmental information via the communication unit to a first device or application of a plurality of devices or applications, the plurality of devices or applications being external to the portable sensor device, and transmitting, if the portable sensor device is located at a second location in the space different from the first location, the second sensor data indicative of the second environmental information via the communication unit to a second device or application of the plurality of devices or applications.

The inventors have recognized that it is beneficial to allow a single portable sensor device comprising multiple types of sensors to be used for multiple applications and that repositioning the portable sensor device is a very intuitive way of switching between applications. The different applications may run on a single device or on a plurality of devices external to the portable sensor device. The sensor data is transmitted to one of the plurality of devices or applications in dependence on the location of the portable sensor device. The location of the portable sensor device may be determined by an (indoor) positioning system, or the location may be predefined or defined by a user.

The method may comprise: if the first sensor data has been transmitted to the first device or application, controlling the first device or application based on the first sensor data, or if the second sensor data has been transmitted to the second device or application, rendering information indicative of the second sensor data on an information rendering device. In other words, if the portable sensor device is located at the first location, the first sensor data is transmitted to the first device or application, whereupon the first device or application is controlled based on the first sensor data. If the portable sensor device is located at the second location, the second sensor data is transmitted to the second device or application, whereupon the second device or application provides information about the second sensor data. This enables a user to place the portable sensor device at the first location whereupon the first device is controlled, or place the portable sensor device at the second location, whereupon information about the sensor data is provided (e.g. rendered on an electronic display). By repositioning the portable sensor device, the user can switch between different applications.

The first device or application is a lighting device or application and the second device or application may be a device or application different from a lighting device or application. This enables a user to place the portable sensor device at the first location whereupon a lighting device or application may be controlled, or place the portable sensor device at the second location, whereupon non-lighting device or non-lighting application may be controlled. For example, the first device or application may be configured to control a light, e.g. turn on and/or off the light, in dependence on the first sensor data. The second device or application may be configured to perform, for example, sleep monitoring, baby monitoring, security monitoring, people counting, pet monitoring and/or health monitoring.

If the portable sensor device is located at the first location, the first sensor may be activated and the second sensor may be deactivated. Additionally or alternatively, if the portable sensor device is located at the second location, the second sensor is activated and the first sensor is deactivated. The activation/deactivation of a respective sensor may be executed when it has been determined that the portable sensor device is located at a certain location. The sensors may be deactivated by default and a certain sensor may only be activated when the portable sensor device is located at a respective location. Alternatively, the sensors may be activated by default and a certain sensor may only be deactivated when the portable sensor device is located at a respective location. In the context of the present invention, deactivation of a sensor may, for example, mean to switch the sensor off (e.g. to power it off), to not use, store, process, analyze or communicate sensor data of the respective sensor, etc. In the context of the present invention, activation of a sensor may, for example, mean to switch the sensor on (e.g. to power it on), to use, store, process, analyze or communicate sensor data of the respective sensor, etc. Deactivation of a sensor is beneficial because it may reduce battery/power usage, the network resources and/or processing resources.

The portable sensor device may comprise a battery. The method may further comprise: determining a charge level of the battery, and, if the portable sensor device is located at the first location, deactivating the second sensor if the charge level exceeds a first threshold, and if the portable sensor device is located at the second location, deactivating the first sensor if the charge level exceeds a second threshold. The thresholds may be the same, or different. The thresholds may be determined or predefined based on the respective types of the respective sensors.

The method may further comprise: determining a sampling rate and/or granularity of the sensor data based on the location of the portable sensor device. If, for example, the portable sensor device is located at the first location, a first sampling rate and/or granularity for the first sensor data may be used, and if the the portable sensor device is located at the second location, a second sampling rate and/or granularity for the second sensor data may be used. If a sensor has been associated with multiple locations, the sampling rate and/or the granularity may be different for different locations. If, for example, the second sensor has been associated with the second location and a third location, a third sampling rate and/or granularity for the second sensor data may be used when the portable sensor device is located at the third location.

The first device or application may be a central control device or application configured to control the second device or application, and the second device or application may be configured to receive control signals from the central control device or application. The first device or application may, for example, be a central (home) control device such as a bridge, and the second device or application may be a (smart) (home) device or application such as a lighting device or application configured to receive control signals from the central (home) control device. This enables the user to position the portable sensor device at a location at which the central control device or application receives the first sensor data. The central control device or application may be configured to control the second device or application based on the first sensor data. Alternatively, the user may position the portable sensor device at a location at which the second device or application receives the second sensor data (directly) from the portable sensor device.

The method may further comprise determining if the portable sensor device has been located at a (first or second) location for a predetermined period of time. The first or second sensor data may be transmitted and/or the first or second sensor may be activated only if the portable sensor device has been located at the location for a predetermined period of time. The determination whether the portable sensor device has been located at a (first or second) location for a predetermined period of time may be performed by monitoring the location of the portable sensor device. Additionally or alternatively, determining whether the portable sensor device has been located at a (first or second) location for a predetermined period of time may be based on sensor data of a motion sensor comprised in the portable sensor device. It may be beneficial to (first) determine that the portable sensor device has been at the same location/has not moved for a predetermined period of time (e.g. 3 seconds, 5 seconds, 1 minute, etc.) and only transmit sensor data or activate a sensor if it has been at the same location, because environmental data may be irrelevant when the sensor device is being moved from a first location to a second location. Additionally or alternatively, the first or second sensor may be activated for a predetermined period of time after the portable sensor device has been positioned at a (first or second) location.

The method may further comprise determining an orientation of the portable sensor device. The first sensor data may be transmitted to the first device or application if the portable sensor device is located at the first location and if the portable sensor device is oriented in a first predefined orientation. The second sensor data may be transmitted to the second device or application if the portable sensor device is located at the second location and if the portable sensor device is oriented in a second predefined orientation.

The location of the portable sensor device may be determined based on a detection of a beacon by a detector comprised in the portable sensor device. This may enable the portable sensor device to determine its location without being dependent on an external positioning system. Alternatively, the position of the portable sensor device may be determined by an external positioning system.

The location of the portable sensor device may be determined based on signal characteristics of radio frequency signals transmitted or received by the portable sensor device. The location of the portable sensor device may be determined by the portable sensor device based on received signals. Alternatively, an external positioning system may determine the location of the portable sensor device based on the transmitted or received signals.

The method may further comprise:

associating the first sensor or the first sensor data with the first location and the first device or application, associating the second sensor or the second sensor data with the second location and the second device or application, and store the associations in a memory. The associations comprise a first association between the first sensor or the first sensor data and the first location and the first device or application, and a second association between the second sensor or the second sensor data with the second location and the second device or application.

The (first and second) associations may be based on user input received via a user interface. The user input is indicative of associating the respective sensor or sensor data with the respective location and device or application. The user input may, for example, be received via a touch screen, a voice interface, etc. This is beneficial, because it enables users to define which sensors are activated at which location.

The first sensor data may be transmitted to the first device and the second sensor data may be transmitted to the second device, The method may further comprise: obtaining information indicative of a first location of the first device and a second location of the second device, determining the associations based on the first location of the first device and the second location of the second device. Associations between the sensors, the sensors' locations and the respective devices or applications may be determined based on the locations of the respective devices. If, for example, a first device is in proximity or closest to the first location, the first location may be associated with that first device, and a second device in proximity or closest to the second location may be associated with that second location, such that when the sensor device is located at the first location, the first sensor data is transmitted to the first device, and such that when the sensor device is located at the second location, the second sensor data is transmitted to the second device.

The method may further comprise: identifying a user present in the space, and determining the associations based on an identity of the identified user. Advantageously, the correct devices or applications are associated with the correct locations for an identified user.

According to a second aspect of the present invention, the object is achieved by a computer program product for a computing device, the computer program product comprising computer program code to perform any of the above-mentioned methods when the computer program product is run on a processing unit of the computing device.

According to a third aspect of the present invention, the object is achieved by a system for monitoring a space, the system comprising:

a portable sensor device for monitoring the space, comprising a first sensor of a first sensor type for providing first sensor data indicative of first environmental information in the space, a second sensor of a second sensor type for providing second sensor data indicative of second environmental information in the space different from the first sensor type, a communication unit configured to communicate with a plurality of devices or applications, the plurality of devices or applications being external to the portable sensor device, a processor configured to:

obtain information indicative of a location of the portable sensor device in the space, and transmit, if the portable sensor device is located at a first location in the space, the first sensor data indicative of the first environmental information via the communication unit to a first device or application of the plurality of devices or applications, and transmit, if the portable sensor device is located at a second location in the space different from the first location, the second sensor data indicative of the second environmental information via the communication unit to a second device. It should be understood that the computer program product and the system may have similar and/or identical embodiments and advantages as the above-mentioned methods.

In the context of the present invention the wording "environmental information in the space" may relate to any type of environmental parameter that can be detected by a respective sensor of a respective type. Examples of environmental information may, for example, be temperature information, environmental illumination information, humidity information, presence/occupancy information, information related to a property or physiological state of a person, animal or plant, information related to a motion or activity of a person or animal, etc. A processor may analyze sensor data to determine the environmental information.

BRIEF DESCRIPTION OF THE DRAWINGS

The above, as well as additional objects, features and advantages of the disclosed systems, devices and methods will be better understood through the following illustrative and non-limiting detailed description of embodiments of devices and methods, with reference to the appended drawings, in which.

All the figures are schematic, not necessarily to scale, and generally only show parts which are necessary in order to elucidate the invention, wherein other parts may be omitted or merely suggested.

DETAILED DESCRIPTION OF EMBODIMENTS

Figure 1A:
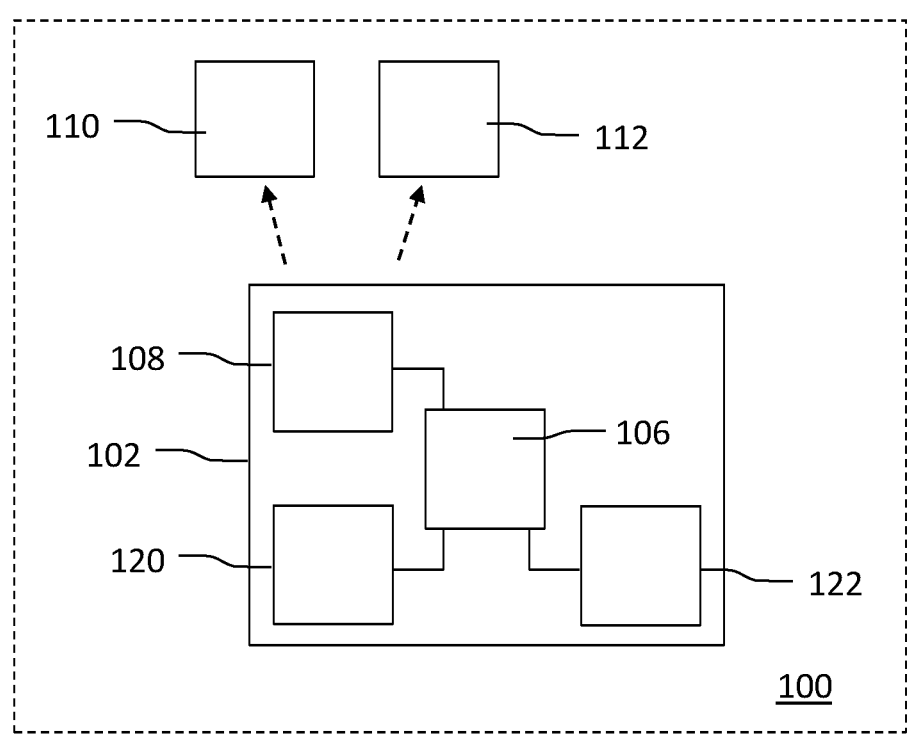
FIGS. 1a and 1b show schematically different configurations of a system for monitoring a space and for communicating sensor data to devices and/or applications.
Figure 1B:
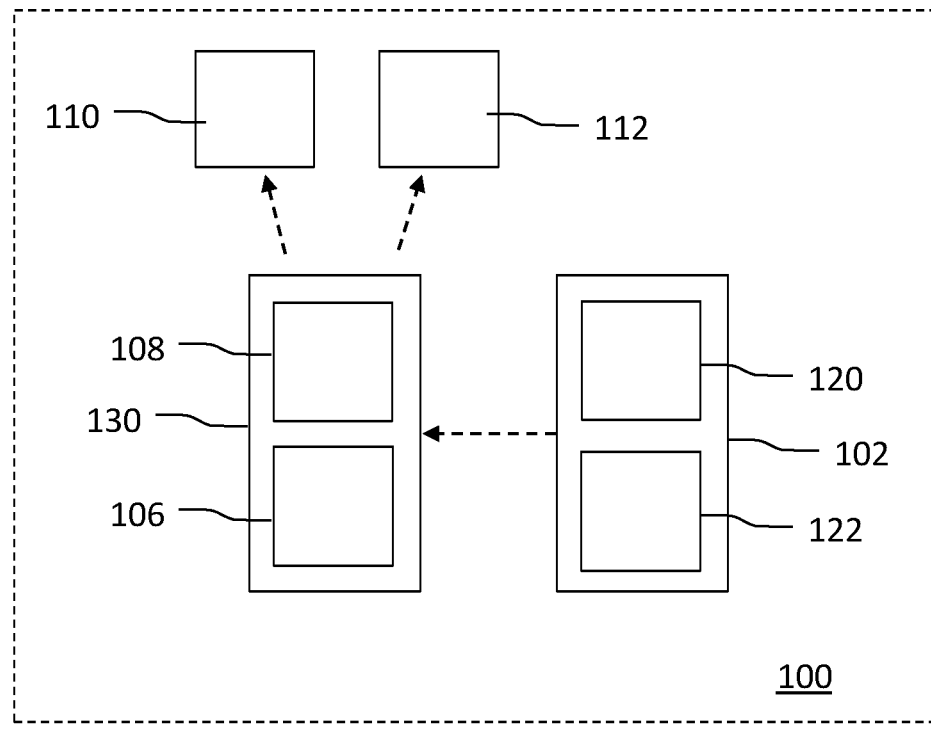

FIGS. 1a and 1b each show a system for monitoring a space 100. The system comprises a portable sensor device 102 for monitoring the space 100. The portable sensor device 102 comprises a first sensor 120 of a first sensor type for providing first sensor data indicative of first environmental information in the space 100. The portable sensor device 102 further comprises a second sensor 122 of a second sensor type for providing second sensor data indicative of second environmental information in the space 100.

The system further comprises a communication unit 108 configured to communicate with a plurality of devices or applications 110, 112 external to the portable sensor device 102 and a processor 106. In the example of FIG. 1a, the first sensor 120, the second sensor 122, the processor 106 and the communication unit 108 are comprised in the portable sensor device 102. In the example of FIG. 1b, the first sensor 120 and the second sensor 122 are comprised in the portable sensor device 102, and the processor 106 and the communication unit 108 are comprised in another device 130 (e.g. in an intermediary device such as a bridge, a smartphone, a central (home) control system, etc.). In this example, the sensor device 102 may comprise a further communication unit (not shown) configured to communicate sensor data from the sensor device 102 to the other device 130 comprising the processor 106 and the communication unit 108.

The processor 106 (e.g. circuitry, a microchip, a microcontroller) is configured to obtain information indicative of a location of the portable sensor device 102 in the space 100, and transmit, if the portable sensor device 102 is located at the first location, the first sensor data indicative of the first environmental information via the communication unit 108 to a first device or application 110 of the plurality of devices or applications 110, 112, and transmit, if the portable sensor device 102 is located at the second location, the second sensor data indicative of the second environmental information via the communication unit 108 to a second device or application 112 of the plurality of devices or applications 110, 112.

The portable sensor device 102 is repositionable by a user. Since the functionality of the portable sensor device 102 (i.e. to which device or application 110 or 112 the sensor data is communicated) is dependent on the sensor device's location, the user may determine the functionality of the portable sensor device 102 by repositioning the portable sensor device 102. The portable sensor device 102 may be attachable to the device 110, 112 (e.g. via a connector such as a plug/socket), and the device 110, 112 may be a lighting device. The location of the portable sensor device 102 may be received from the device 110, 112 to which it has been attached. This enables 'upgrading' a lighting device by attaching the portable sensor device to the lighting device. The portable sensor device 102 may be connected to a central (home/office) control system and communicate sensor data to the central (home/office) control system, or directly to controllable devices or applications.

The portable sensor device 102 is configured to monitor environmental conditions of the space 100. The portable sensor device 102 comprises the first sensor 120 of the first sensor type for providing first sensor data indicative of first environmental information in the space 100 and the second sensor 122 of a second sensor type (different from the first sensor type) for providing second sensor data indicative of second environmental information in the space. The first sensor 120 may comprise a single sensor (e.g. a single microphone, or a single thermopile sensor) or a plurality of (the same type of) sensors (e.g. an array of microphones, an array of thermopile sensors). Such environmental information/conditions may relate to any type of environmental parameter that can be detected by a respective sensor, which sensor provides sensor data indicative of environmental information. Examples of types of such sensors are temperature sensors (for providing sensor data indicative of temperature information), light sensors (for providing sensor data indicative of environmental illumination information), vision sensors (for providing sensor data indicative of environmental objects and/or events), humidity sensors (for providing sensor data indicative of humidity information), motion/presence sensors such as PIR sensors, RF sensors, thermopile sensors, cameras, etc. (for providing sensor data indicative of presence/occupancy information), etc.

The communication unit 108 is configured to communicate with the plurality of devices or applications 110, 112. The communication unit 108 may be configured to communicate with the devices 110, 112 (which may be running the applications), either directly or indirectly. The communication unit 108 may be configured to communicate via any wired or wireless communication protocol (e.g. Ethernet, DALI, Bluetooth, Wi-Fi, Li-Fi, Thread, ZigBee, etc.). The communication unit 108 may be configured to communicate via multiple communication protocols, for example via a mesh network protocol such as Zigbee with the first device 110, and via a point-to-point network protocol such as Wi-Fi and/or Bluetooth with the second device 112.

The processor 106 is configured to determine the location of the portable sensor device 102 in the space 100. The location may for example be defined as a set of coordinates in the space 102 or as an area defined by multiple sets or coordinates. Alternatively, the location may be defined by an area in the space 100 which may have been defined by a user (e.g. "kitchen", "office", "corridor", "garden", etc.). The space 100 may be a room, a building, an outdoor area, etc. The processor 106 may be configured to obtain location information indicative of the location of the portable sensor device 102 in the space 100. The location information may, for example, be obtained from a (local or external) memory configured to store a current location of the portable sensor device. The location information may be obtained from an (indoor) positioning system (e.g. an RF-based positioning system that uses triangulation or trilateration, a VLC based positioning system, a VSLAM positioning system, etc.) configured to detect the location of the portable sensor device 102 in the space 100. Such (indoor) positioning systems are known in the art and will therefore not be discussed in detail. Alternatively, the processor 106 may be configured to obtain the location of the portable sensor device 102 by determining the location based on signals received from (networked) devices such as the first device 110 and the second device 112. The processor 106 may determine the location based on one or more characteristics (e.g. based on the time of flight or the signal strength) of received RF (radio frequency) signals communicated between the portable sensor device 102 and other devices (such as the first and second device 110, 122). Determining the position of a device based on one or more characteristics of received RF signals is known in the art and will therefore not be discussed in detail. Alternatively, the location of the portable sensor device 102 may be determined based on a detection of a beacon by a detector comprised in the portable sensor device 102. The detector may be configured to detect the presence (and optionally the distance to) the beacon. The beacon may, for example, be a VLC beacon, a passive RF beacon such as a passive NFC tag, an active RF beacon which emits an RF signal, a QR code, etc.

The processor 106 is further configured to transmit sensor data to a device or application based on the location of the portable sensor device 102. The space 100 may, for example, be divided in areas and certain areas may be associated with certain sensors of the portable sensor device 102. If the portable sensor device 102 is located at a first location (e.g. in a first area) in the space 100, the first sensor data indicative of the first environmental information from the first sensor 120 may be transmitted to the first device or application 110 via the communication unit 108. If the portable sensor device 102 is located at a second location (e.g. in a second area) in the space 100, the second sensor data indicative of the second environmental information from the second sensor 122 may be transmitted to the second device or application 112 via the communication unit 108.

Figure 2A:
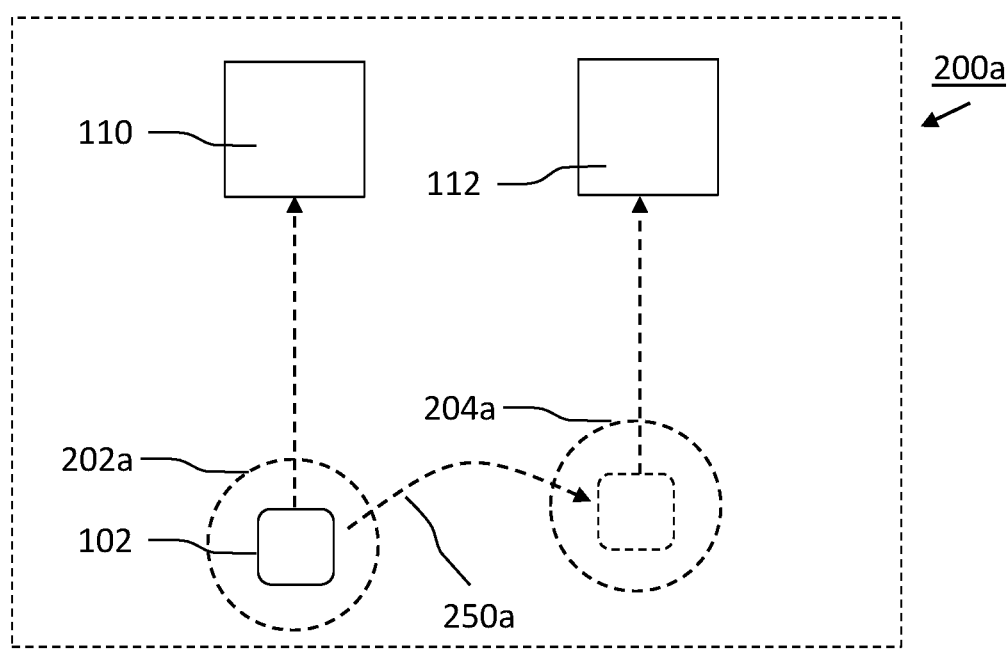
FIGS. 2a and 2b show schematically embodiments of spaces comprising devices and a portable sensor device.
Figure 2B:
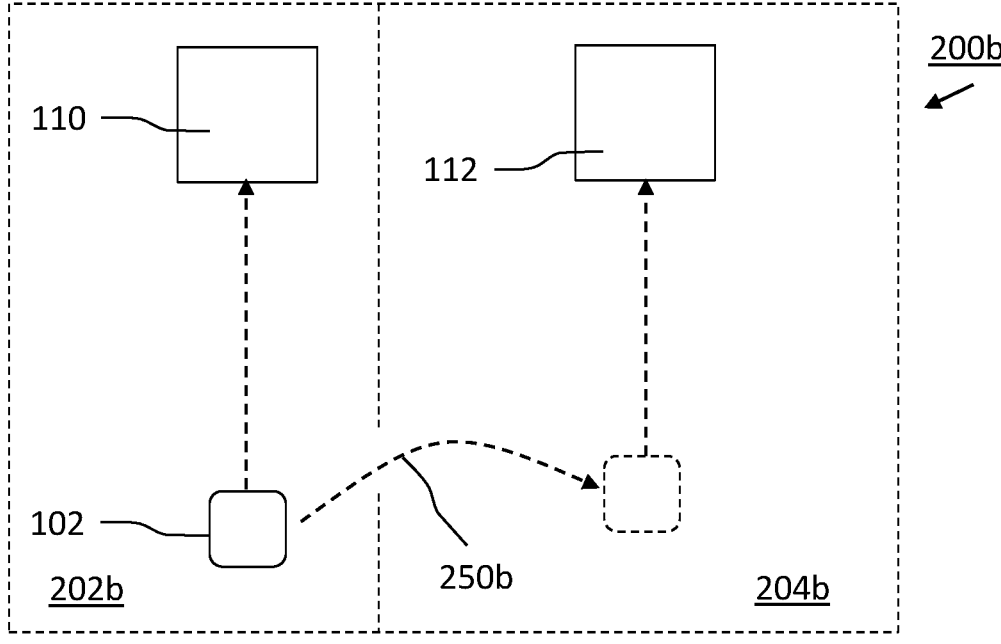

The plurality of devices or applications comprise the first device or application 110 and the second device or application 112. In the examples of FIGS. 1, 2a and 2b the devices or applications 110, 112 are depicted as devices located at different locations in the space 100. It should be understood that this is an example of a plurality of devices or applications. In another example, a plurality of applications (comprising the first and second application) may be running on one or more devices located in the space 100, or be located remotely and be accessible via a network/the internet. The different applications may run on a single device or on a plurality of devices. The plurality of applications may for example be running on a remote server. Examples of applications include but are not limited to security/people monitoring, people counting, temperature monitoring, health monitoring, etc. In dependence on the location of the portable sensor device 102, the sensor data is may be transmitted to a respective application.

The processor 106 is configured to transmit the first or second sensor data to the first or second device, respectively, based on the location of the portable sensor device 102. The sensor data is indicative of respective environmental information. The sensor data that is transmitted to a respective device may be raw sensor data. Alternatively, the sensor data may have already been analyzed by the processor 106 and the environmental information may have been extracted (e.g. a temperature value, an occupation/presence value, a number of people present, a light level, etc.), and the analyzed sensor data may be transmitted to a respective device.

FIGS. 2a and 2b illustrate examples of spaces 200a, 200b comprising devices 110, 112 and a portable sensor device 102. In the example of FIG. 2a, the portable sensor device 102 is located at first location/area 202a. The processor 106 (not shown) may transmit the first sensor data of the first sensor to the first device 110 when the portable sensor device 102 is located at first location/area 202a. A user may move 250a the portable sensor device 102, whereupon the processor 106 may determine that the portable device 102 is located at second location 204a. The processor 106 may transmit the second sensor data of the second sensor to the second device 112 when the portable sensor device 102 is located at second location/area 204a. In this example, the locations/areas 202a, 204a may be areas/locations defined by coordinates in the space 200a. In the example of FIG. 2b, the locations/areas 202b, 204b in the space 200b are defined as rooms. A memory may store information indicative of the locations and the names of the rooms. First room 202b may, for example, be defined as "kitchen" and second room 204b may, for example, be defined as "living room". In the example of FIG. 2b, the portable sensor device 102 is located in the first room 202b. The processor 106 (not shown) may transmit the first sensor data of the first sensor to the first device 110 when the portable sensor device 102 is located in the first room 202b. A user may move 250b the portable sensor device 102, whereupon the processor 106 may determine that the portable device 102 is located in the second room 204b. The processor 106 may transmit the second sensor data of the second sensor to the second device 112 when the portable sensor device 102 is located in the second room 204b.

In a first example, the portable sensor device 102 may comprise a (first) motion sensor and a (second) light sensor. The first device 110 may be a camera, for instance a security camera, and the second device 110 may be a lighting device which comprises one or more light sources. If the user places the portable sensor device 102 at the first location (e.g. 202a, 202b), the processor 106 may determine that the portable sensor device 102 is located at the first location 202a, and transmit the sensor data of the motion sensor (e.g. data indicating that motion has been detected) to the camera (e.g. to switch the camera on). If the user places the portable sensor device 102 at the second location (e.g. 204a, 204b), the processor 106 may determine that the portable sensor device 102 is located at the second location, and transmit the sensor data of the light sensor (e.g. data indicating a current light level) to the lighting device (e.g. to control the light output of the light sources based on the current light level).

In a second example, the portable sensor device 102 may comprise a (first) vision sensor (e.g. a camera) and a (second) presence sensor (e.g. a PIR sensor). The first application 110 may be a people monitoring application running on a local or remote server, and the second device 110 may be a lighting device which comprises one or more light sources. If the user places the portable sensor device 102 at the first location (e.g. 202a, 202b), the processor 106 may determine that the portable sensor device 102 is located at that location, and transmit the sensor data of the camera (e.g. video captured by the camera) to the first application 110 (e.g. to enable people monitoring). If the user places the portable sensor device 102 at the second location (e.g. 204a, 204b), the processor 106 may determine that the portable sensor device 102 is located at that location, and transmit the sensor data of the PIR sensor (e.g. indicating presence of a user) to the lighting device (e.g. to control the light output of the light sources when presence has been detected).

In another example, the portable sensor device 102 may comprise a (first) audio sensor (e.g. a microphone) and a (second) presence sensor (e.g. a single-pixel thermopile sensor). The first device 110 may be a voice-controlled intelligent personal assistant, and the second device 110 may be a connected doorbell system. If the user places the portable sensor device 102 at the first location (e.g. 202a, 202b), the processor 106 may determine that the portable sensor device 102 is located at the first location, and transmit/stream the sensor data of the audio sensor (e.g. audio/voice data captured by the microphone) to the voice-controlled intelligent personal assistant (e.g. to provide voice input to the voice-controlled intelligent personal assistant). If the user places the portable sensor device 102 at the second location (e.g. 204a, 204b) (e.g. at the user's front door), the processor 106 may determine that the portable sensor device 102 is located at the second location, and transmit the sensor data of the presence sensor (e.g. indicating presence of a person) to the connected doorbell system (e.g. to control the doorbell to inform a user that a person is present).

The processor 106 may be configured to transmit the sensor data of a respective sensor to control the respective device or application 110. Alternatively, the processor 106 may be configured to transmit sensor data of a respective sensor to render information indicative of the respective sensor data on an information rendering device (e.g. a personal mobile device such as a smartphone, on a monitoring device, on the respective device or application, etc.). The processor 106 may, for example, transmit the first sensor data (e.g. a current ambient light level) of the first sensor 120 (e.g. a light sensor) to control the first device 110 (e.g. a lighting device) based on the first sensor data (e.g. by increasing or decreasing the light output of the lighting device based on the current ambient light level). The processor 106 may, for example, transmit the second sensor data (e.g. video data) of the second sensor 122 (e.g. a camera) to the second device 112 (e.g. a smartphone) to render the second sensor data on the second device (e.g. rendering the video data on the smartphone of the user).

The processor 106 may be configured to activate and/or deactivate the sensors 120, 122 based on the location of the portable sensor device 102. If, for example, the portable sensor device 102 is located at the first location, the processor 106 may activate the first sensor 120 and deactivate the second sensor, and vice versa. The sensors 120, 122 may be deactivated by default and a certain sensor may only be activated when the portable sensor device 102 is located at a respective location. Alternatively, the sensors 120, 122 may be activated by default and a certain sensor may only be deactivated when the portable sensor device 102 is located at a respective location. The processor 106 may, for example, deactivate a sensor by switching the sensor off (e.g. by powering it off), or by refraining from using, storing or communicating sensor data of the respective sensor, etc. The processor 106 may, for example, activate a sensor by switching the sensor on (e.g. by powering it on), or by using, storing or communicating sensor data of the respective sensor, etc.

The portable sensor device 102 may comprise a battery. The processor 106 may be configured to activate and/or deactivate sensors based on a charge level of the battery. The processor 106 may be configured to determine the charge level of the battery, and, if the portable sensor device 102 is located at the first location, deactivate the second sensor 122 if the charge level exceeds a first threshold, and if the portable sensor device 102 is located at the second location, deactivate the first sensor 120 if the charge level exceeds a second threshold. The thresholds may be the same, or different. The thresholds may be determined or predefined based on the respective types of the respective sensors.

The processor 106 may be further configured to determine/set a sampling rate and/or granularity of the sensor data based on the location of the portable sensor device 102. If, for example, the portable sensor device 102 is located at the first location, a first sampling rate and/or granularity for the first sensor data may be used, and if the the portable sensor device 102 is located at the second location, a second sampling rate and/or granularity for the second sensor data may be used. If a sensor has been associated with multiple locations, the sampling rate and/or the granularity may be different for different locations. If, for example, the second sensor has been associated with the second location and a third location, a third sampling rate and/or granularity for the second sensor data may be used when the portable sensor device 102 is located at the third location. The sampling rate may be indicative of a number of sensor readings per time period (e.g. images per second of a camera, temperature measurements of a temperature sensor, etc.), and the granularity may be indicative of the size of the sensor data (e.g. image resolution of images captured by a camera).

The first device or application 110 may be a central control device or application configured to control the second device or application 112, and the second device or application 112 may be configured to receive control signals from the central control device or application. The first device or application 110 may, for example, be a central (home) control device such as a bridge, and the second device or application 112 may be a (smart) (home) device or application such as a lighting device or lighting application configured to receive control signals from the central (home) control device. A user may for example position the portable sensor device 102 at a location at which the central control device or application receives the first sensor data from the portable sensor device 102. The central control device or application may be configured to control the second device or application based on the first sensor data. The user may then position the portable sensor device 102 at a location at which the second device or application receives the second sensor data (directly) from the portable sensor device 102, and the second device may be controlled by the processor 106 based on the second sensor data.

The processor 106 may be further configured to determine if the portable sensor device 102 has been located at a (first or second) location for a predetermined period of time. The processor 106 may start a timer when the location of the portable sensor device 102 does not change. The processor 106 may transmit the first or second sensor data and/or activate the first or second sensor only if the portable sensor device 102 has been located at the location for the predetermined period of time.

Additionally or alternatively, the processor 102 may be configured to activate the first or second sensor for a predetermined period of time after the portable sensor device 102 has been positioned at a (first or second) location. The processor 106 may, for example, activate a sensor for a number of minutes, hours or days. If, for example, the first sensor 120 (or the second sensor 122) is a camera, the camera may be activated for the predetermined period of time to enable monitoring of the space for that period of time.

The processor 106 may be further configured to associate the sensors (or their respective sensor data) with locations in the space 100 and with the devices or applications. The processor 106 may, for example, be configured to associate the first sensor 120 or the first sensor data with the first location and the first device or application 110. The processor may be further configured to associate the second sensor 122 or the second sensor data with the second location and the second device or application 120. The processor 106 may be further configured to store the associations in a memory. The memory may be located in the portable sensor device 102, or in an external device. The associations comprise a first association between the first sensor 120 or the first sensor data and the first location and the first device or application 110, and a second association between the second sensor 122 or the second sensor data with the second location and the second device or application 112.

The associations may be based on various inputs. The associations may, for example, be defined by a user via a user interface, based on the locations of the first and second devices 110, 112, based on the types of the first and second devices 110, 112 and/or based on an identity of a user.

The associations may be learned over time based on (historical) sensor data of the first and second sensors 120, 122. The processor 102 may for example determine based on historical sensor data of the first sensor that the first sensor 120 (e.g. a motion sensor) senses more motion at a first location compared to another (second) location, an association between that location and the first sensor 120 may be created. The processor 102 may for example determine that a first sensor 120 (e.g. a motion sensor) of the portable sensor device 102 detects more sensor data or more variations in sensor data (e.g. motion data) at a first location compared to another (second) location, and the processor 102 may therefore associate the first location with the first sensor 120. The processor 102 may for example determine that a second sensor 122 (e.g. a light sensor) of the portable sensor device 102 detects more sensor data or more variations in sensor data (e.g. a higher variation in light intensity) at a second location compared to another (first) location, and the processor 102 may therefore associate the second location with the second sensor 122. This enables the processor 102 to learn the associations based on historical sensor data.

Figure 3:
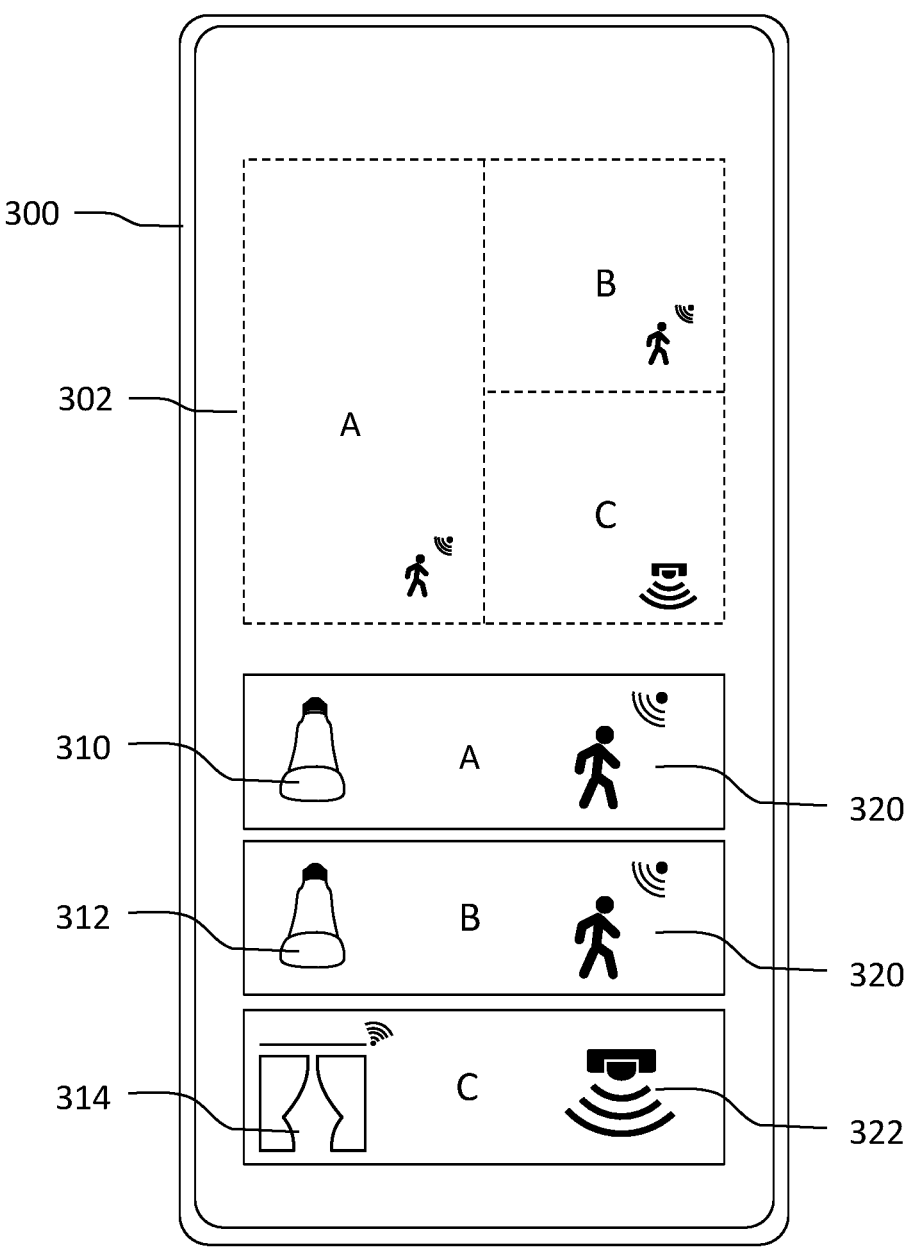
FIG. 3 shows schematically a user interface for associating locations with sensors and devices or applications.

The (first and second) associations may be based on user input received via a user interface. The user input is indicative of associating the respective sensor or sensor data with the respective location and device or application. The user input may, for example, be received via a touch screen, a voice interface (a user may provide voice commands to create the associations), etc. FIG. 3 illustrates an example of a user interface on a touch screen. The user interface shows (top) a space 302 comprising three areas (e.g. room) A, B and C. Three devices are installed in the space: a first lighting device 310, a second lighting device 312 and electric curtains 314. The portable sensor device 102 (not shown in FIG. 3) comprises a presence sensor 320 (e.g. a PIR sensor or a camera) and a light sensor 322 (e.g. a photodiode). A user may provide user input on the touch screen to associate the sensors 320, 322 with locations A, B, C in the space 302 and with the devices 310, 312, 314 (for example by selecting devices, areas and sensors from different drop-down menus (not shown), or by dragging different on-screen icons 320, 322 of sensors onto the areas A, B, C). In the example of FIG. 3, the user has associated sensor 320 with area A such that sensor data of sensor 320 controls lighting device 310 when the portable sensor device 102 is located in area A. The user has also associated sensor 320 also with area B such that sensor data of sensor 320 controls lighting device 312 when the portable sensor device 102 is located in area B. The user has further associated sensor 322 with area C such that sensor data of sensor 322 controls the electric curtains 314 when the portable sensor device 102 is located in area C.

The user interface may be further configured to receive user inputs indicative of activating/deactivating respective sensors at respective locations. The user may, for example, indicate via the user interface that a first sensor (e.g. a camera) is to be deactivated when the portable sensor device 102 is located at the second location (e.g. in the bedroom). Additionally, the user interface may be further configured to receive user inputs indicative of activating/deactivating respective sensors at respective locations based on contextual information at a respective location. The user may, for example, indicate via the user interface that a first sensor (e.g. a light sensor) is to be deactivated when the portable sensor device 102 is located at the second location based on contextual information at the second location (e.g. when the ambient light level is below a certain value, when an occupancy value is below a certain value, etc.).

The (first and second) associations may be based on the locations of the first and second devices 110, 122. The processor 106, may obtain information indicative of a first location of the first device 110 and a second location of the second device 122, and determine the associations based on the first location of the first device 110 and the second location of the second device 112. If, for example, a first device 110 is in proximity of the first location or closer to the first location compared to the second device 112, the first location may be associated with that first device 110, and a second device 112 in proximity of the second location or closer to the second location compared to the first device 110 may be associated with that second location, such that when the portable sensor device 102 is located at the first location, the first sensor data is transmitted to the first device 110, and such that when the sensor device 112 is located at the second location, the second sensor data is transmitted to the second device 112.

The (first and second) associations may be based on the identity of a user who is present in the space 100. The user may de detected by a presence sensor (which may be located in the portable sensor device 102). The user may be identified based on face recognition of the user, based on voice recognition of the user, based on the presence of a portable device carried by the user, etc. User presence detection and identification techniques are known in the art and will therefore not be discussed in detail. The user identity may be compared to a plurality of user identities that are stored in a (local or remote) memory. The user identities may be associated with user preferences, indicative of associations between sensors (or their respective sensor data), locations and devices or applications. If an identity matches one of the user identities in the memory, the respective user preference matching that identity may be selected and the respective associations may be used.

The associations may be determined based on/derived from a location type, for example a room type or an area type. In an example, the first location may be a hallway, the second location may be a front door entrance, the first sensor may be a presence sensor and the second sensor may be a camera. Based on the location type, the processor 106 may associate a respective sensor with a respective location. The processor 106 may, for example, associate the camera with the front door entrance and with a home monitoring system, such that when the portable sensor device 102 is located at the front door entrance a video feed from the camera is transmitted to the home monitoring system. Additionally, the processor may, for example, associate the presence sensor with the hallway and with a lighting control system, such that when the portable sensor device 102 is located in the hallway, sensor data from the presence sensor is transmitted to the lighting control system to control the lights based on the presence.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer or processing unit. In the device claim enumerating several means, several of these means may be embodied by one and the same item of hardware. The mere fact that certain measures are recited in mutually different dependent claims does not indicate that a combination of these measures cannot be used to advantage.

Aspects of the invention may be implemented in a computer program product, which may be a collection of computer program instructions stored on a computer readable storage device which may be executed by a computer. The instructions of the present invention may be in any interpretable or executable code mechanism, including but not limited to scripts, interpretable programs, dynamic link libraries (DLLs) or Java classes. The instructions can be provided as complete executable programs, partial executable programs, as modifications to existing programs (e.g. updates) or extensions for existing programs (e.g. plugins). Moreover, parts of the processing of the present invention may be distributed over multiple computers or processors or even the 'cloud'.

Storage media suitable for storing computer program instructions include all forms of nonvolatile memory, including but not limited to EPROM, EEPROM and flash memory devices, magnetic disks such as the internal and external hard disk drives, removable disks and CD-ROM disks. The computer program product may be distributed on such a storage medium, or may be offered for download through HTTP, FTP, email or through a server connected to a network such as the Internet.

The invention claimed is:

1. A method of monitoring a space by a portable sensor device, the portable sensor device comprising a first sensor of a first sensor type for providing first sensor data indicative of first environmental information in the space, and a second sensor of a second sensor type different from the first sensor type for providing second sensor data indicative of second environmental information in the space, the method comprising:

determining a location of the portable sensor device in the space, determining if the portable sensor device has been located at the location for a predetermined period of time, transmitting, if the portable sensor device is located at a first location in the space, the first sensor data indicative of the first environmental information via the communication unit to a first device or application of a plurality of devices or applications, the plurality of devices or applications being external to the portable sensor device, and transmitting, if the portable sensor device is located at a second location in the space different from the first location, the second sensor data indicative of the second environmental information via the communication unit to a second device or application of the plurality of devices or applications, wherein the first or second sensor data is transmitted and/or the first or second sensor is activated only if the portable sensor device has been located at the location for the predetermined period of time.

2. The method of claim 1, wherein the method comprises:

if the first sensor data has been transmitted to the first device or application, controlling the first device or application based on the sensor data, or if the second sensor data has been transmitted to the second device or application, rendering information indicative of the second sensor data on an information rendering device.

3. The method of claim 1, wherein the first device or application is a lighting device or application and the second device or application is a device or application different from a lighting device or application.

4. The method of claim 1, wherein, if the portable sensor device is located at the first location, the first sensor is activated and the second sensor is deactivated, and/or wherein, if the portable sensor device is located at the second location, the second sensor is activated and the first sensor is deactivated.

5. The method of claim 1, wherein the portable sensor device comprises a battery, and wherein the method further comprises:

determining a charge level of the battery, if the portable sensor device is located at the first location, deactivating the second sensor if the charge level exceeds a first threshold, and if the portable sensor device is located at the second location, deactivating the first sensor if the charge level exceeds a second threshold.

6. The method of claim 1, wherein the first device or application is a central control device or application configured to control the second device or application, and wherein the second device or application is configured to receive control signals from the central control device or application.

7. The method of claim 1, wherein the location of the portable sensor device is determined based on a detection of a beacon by a detector comprised in the portable sensor device.

8. The method of claim 1, wherein the location of the portable sensor device is determined based on signal characteristics of radio frequency signals transmitted or received by the portable sensor device.

9. The method of claim 1, further comprising:

associating the first sensor or the first sensor data with the first location and the first device or application, associating the second sensor or the second sensor data with the second location and the second device or application, and store the associations in a memory.

10. The method of claim 9, wherein the associations are based on user input received via a user interface.

11. The method of claim 9, wherein the first sensor data is transmitted to the first device and wherein the second sensor data is transmitted to the second device, the method further comprising:

obtaining information indicative of a first location of the first device and a second location of the second device, determining the associations based on the first location of the first device and the second location of the second device.

12. The method of claim 9, further comprising:

identifying a user present in the space, and determining the associations based on an identity of the identified user.

13. A non-transitory computer readable medium comprising computer program code to perform the method of claim 1 when run on at least one processor.

14. A system for monitoring a space, the system comprising:

a portable sensor device for monitoring the space, comprising a first sensor of a first sensor type for providing first sensor data indicative of first environmental information in the space, a second sensor of a second sensor type different from the first sensor type for providing second sensor data indicative of second environmental information in the space, a communication unit configured to communicate with a plurality of devices or applications, the plurality of devices or applications being external to the portable sensor device, a processor configured to:

obtain information indicative of a location of the portable sensor device in the space, determine if the portable sensor device has been located at the location for a predetermined period of time, transmit, if the portable sensor device is located at a first location in the space, the first sensor data indicative of the first environmental information via the communication unit to a first device or application of the plurality of devices or applications, and transmit, if the portable sensor device is located at a second location in the space different from the first location, the second sensor data indicative of the second environmental information via the communication unit to a second device or application of the plurality of devices or applications, wherein the first or second sensor data is transmitted and/or the first or second sensor is activated only if the portable sensor device has been located at the location for the predetermined period of time.

* * * * *